(12) United States Patent
Kim

(10) Patent No.: US 9,646,967 B2
(45) Date of Patent: May 9, 2017

(54) SEMICONDUCTOR DEVICE

(71) Applicant: SAMSUNG ELECTRONICS CO., LTD., Suwon-si, Gyeonggi-do (KR)

(72) Inventor: Ju-Youn Kim, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/990,951

(22) Filed: Jan. 8, 2016

(65) Prior Publication Data
US 2016/0358913 A1 Dec. 8, 2016

(30) Foreign Application Priority Data
Jun. 4, 2015 (KR) .................... 10-2015-0079016

(51) Int. Cl.
*H01L 29/49* (2006.01)
*H01L 27/088* (2006.01)
*H01L 29/423* (2006.01)
*H01L 29/06* (2006.01)

(52) U.S. Cl.
CPC ...... *H01L 27/0886* (2013.01); *H01L 29/0649* (2013.01); *H01L 29/42356* (2013.01); *H01L 29/495* (2013.01); *H01L 29/4916* (2013.01); *H01L 29/4966* (2013.01)

(58) Field of Classification Search
CPC ............ H01L 27/0886; H01L 29/0649; H01L 29/495; H01L 29/4966; H01L 29/42356; H01L 29/4916; H01L 29/66674; H01L 29/66712; H01L 29/7802; H01L 29/7816
See application file for complete search history.

(56) References Cited

U.S. PATENT DOCUMENTS

| | | | |
|---|---|---|---|
| 8,350,253 B1 | 1/2013 | Zhu et al. | |
| 8,551,843 B1 | 10/2013 | Cai et al. | |
| 8,685,808 B2 | 4/2014 | Tsai et al. | |
| 8,692,334 B2 | 4/2014 | Chiou et al. | |
| 8,697,523 B2 | 4/2014 | Cai et al. | |
| 8,703,594 B2 | 4/2014 | Yeh et al. | |
| 2012/0217583 A1 | 8/2012 | Zhu et al. | |
| 2013/0240956 A1 | 9/2013 | Hou et al. | |
| 2014/0117454 A1* | 5/2014 | Liu ...................... | H01L 29/785 257/368 |
| 2014/0203372 A1 | 7/2014 | Yeh et al. | |
| 2014/0353741 A1 | 12/2014 | Montanini et al. | |
| 2015/0021695 A1 | 1/2015 | Hu et al. | |
| 2015/0214341 A1* | 7/2015 | Shin .................. | H01L 29/66818 257/401 |

\* cited by examiner

*Primary Examiner* — Roy Potter
*Assistant Examiner* — Paul Patton
(74) *Attorney, Agent, or Firm* — Lee & Morse P.C.

(57) ABSTRACT

Semiconductor devices are provided. The semiconductor device includes a first fin portion and a second fin portion arranged on a substrate and extended in a first direction, the first fin portion and the second fin portion being spaced apart from each other in the first direction, a field insulating layer between the first fin portion and the second fin portion and having an upper surface thereof lower than an upper surface of the first fin portion, a first metal gate extended in a second direction on the first fin portion and a silicon gate extended in the second direction on the field insulating layer and contacting the field insulating layer.

20 Claims, 14 Drawing Sheets

1200

1300

1400

SEMICONDUCTOR DEVICE

CROSS-REFERENCE TO RELATED APPLICATION

This application claims priority under 35 U.S.C. §119 to Korean Patent Application No. 10-2015-0079016 filed on Jun. 4, 2015, the content of which is hereby incorporated herein by reference in its entirety.

BACKGROUND

1. Technical Field

The present disclosure relates to a semiconductor device.

2. Description of the Related Art

As a scaling technology to increase the density of a semiconductor device, a multi-gate transistor including a fin-shaped or nanowire-shaped, multi-channel active pattern (or silicon body) formed on a substrate and a gate formed on a surface of the multi-channel active pattern has been suggested. Since the multi-gate transistor includes a three-dimensional channel, the scaling of the transistor may be facilitated. In addition, current control capability may be improved even without an increase in a gate length of the multi-gate transistor. Moreover, a short channel effect (SCE) in which the potential of a channel region is affected by a drain voltage may be effectively suppressed.

SUMMARY

Embodiments may provide a semiconductor device having improved reliability.

Embodiments may also provide a semiconductor device having a stable element isolation region.

According to an aspect of embodiments, there is provided a semiconductor device including a first fin portion and a second fin portion arranged on a substrate and extended in a first direction, the first fin portion and the second fin portion being spaced apart from each other in the first direction, a field insulating layer disposed between the first fin portion and the second fin portion and having an upper surface thereof lower than an upper surface of the first fin portion, a first metal gate extended in a second direction on the first fin portion and a silicon gate extended in the second direction on the field insulating layer and contacting the field insulating layer.

In some embodiments, a bottom surface of the silicon gate is lower than the upper surface of the first fin portion and the upper surface of the second fin portion.

In some embodiments, a bottom surface of the silicon gate has a width narrower than that of the upper surface of the field insulating layer.

In some embodiments, the semiconductor device further includes a spacer disposed on at least one side of the silicon gate, wherein the spacer is in non-contact with the first fin portion and the second fin portion.

In some embodiments, a distance from the upper surface of the first fin portion to an upper surface of the first metal gate is smaller than a distance from the upper surface of the field insulating layer to an upper surface of the silicon gate.

In some embodiments, the upper surface of the first metal gate and the upper surface of the silicon gate are coplanar positioned.

In some embodiments, the field insulating layer is extended to lower portions of the first and second fin portions to cover at least portions of the respective first and second fin portions, while not contacting upper portions of the first and second fin portions.

In some embodiments, the upper surface of the field insulating layer is flat.

In some embodiments, the semiconductor device further includes a source/drain disposed between the first metal gate and the silicon gate and formed within an upper portion of the first fin portion.

In some embodiments, the semiconductor further includes an interlayer insulating layer formed on the first fin portion, the second fin portion, and the field insulating layer and including a first trench partially exposing the first fin portion and a second trench partially exposing the field insulating layer, wherein the first metal gate is disposed within the first trench and the silicon gate is disposed within the second trench.

In some embodiments, the interlayer insulating layer is extended from the upper surface of the field insulating layer, and wherein the upper surface of the interlayer insulating layer and the upper surface of the silicon gate are formed coplanar position.

According to another aspect of embodiments, there is provided a semiconductor device including a first fin portion and a second fin portion arranged parallel to each other in the longitudinal direction on the substrate, and included a long side and a short side respectively, a trench disposed between the short side of the first fin portion and the short side of the second fin portion, the short side of the first fin portion and the short side of the second fin portion facing each other, a field insulating layer to filling a portion of the trench, a silicon gate arranged on the field insulating layer and traversed between the first pin portion and the second pin portion and a metal gate intersecting the first fin portion, wherein a bottom surface of the silicon gate is lower than the upper surface of the first fin portion and the upper surface of the second fin portion.

In some embodiments, the silicon gate is spaced from the first pin and the second pin.

In some embodiments, a bottom surface of the silicon gate has a width narrower than that of the upper surface of the field insulating layer.

In some embodiments, the upper surface of the first metal gate and the upper surface of the silicon gate are coplanar positioned.

According to yet another aspect of embodiments, there is provided a first fin portion and a second fin portion arranged on a substrate and extended in a first direction, the first fin portion and the second fin portion being spaced apart from each other in the first direction, a field insulating layer disposed between a lower portion of the first fin portion and a lower portion of the second fin portion and exposed a upper portion of the first fin portion and a upper portion of the second fin portion, a first metal gate extended in a second direction on the first fin portion and a silicon gate extended in the second direction on the field insulating layer and contacting the field insulating layer, wherein a height of the silicon gate is higher than a height of the upper portion of the first fin portion and a height of the upper portion of the second fin portion.

In some embodiments, a bottom surface of the silicon gate is lower than the upper surface of the first fin portion and the upper surface of the second fin portion.

In some embodiments, wherein the upper surface of the first metal gate and the upper surface of the silicon gate are coplanar positioned.

In some embodiments, the semiconductor further includes an interlayer insulating layer formed on the first fin portion, the second fin portion, and the field insulating layer and including a first trench exposing the upper portion of the first fin portion and a second trench partially exposing the field insulating layer, wherein the first metal gate is disposed within the first trench and the silicon gate is disposed within the second trench.

In some embodiments, the semiconductor device further includes a spacer disposed on at least one side of the silicon gate, wherein the spacer is in non-contact with the first fin portion and the second fin portion.

BRIEF DESCRIPTION OF DRAWINGS

The above and other aspects and features will become more apparent by describing in detail exemplary embodiments with reference to the attached drawings, in which.

DETAILED DESCRIPTION

Figure 1:
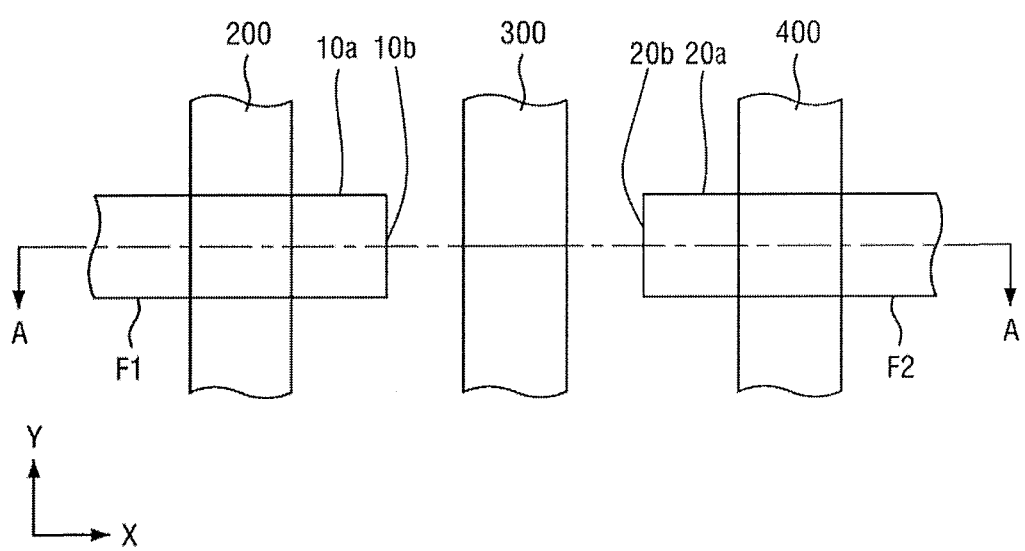
FIG. 1 is a layout view of a semiconductor device according to an example embodiment.

Advantages and features of embodiments and methods of accomplishing the same may be understood more readily by reference to the following detailed description of preferred embodiments and the accompanying drawings. The embodiments may, however, be embodied in many different forms and should not be construed as being limited to those set forth herein. Rather, these embodiments are provided so the disclosure will be thorough and complete and will fully convey exemplary implementations to those skilled in the art. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to an exemplary embodiment will be described with reference to FIG. 1 through FIG. 4.

Figure 2:
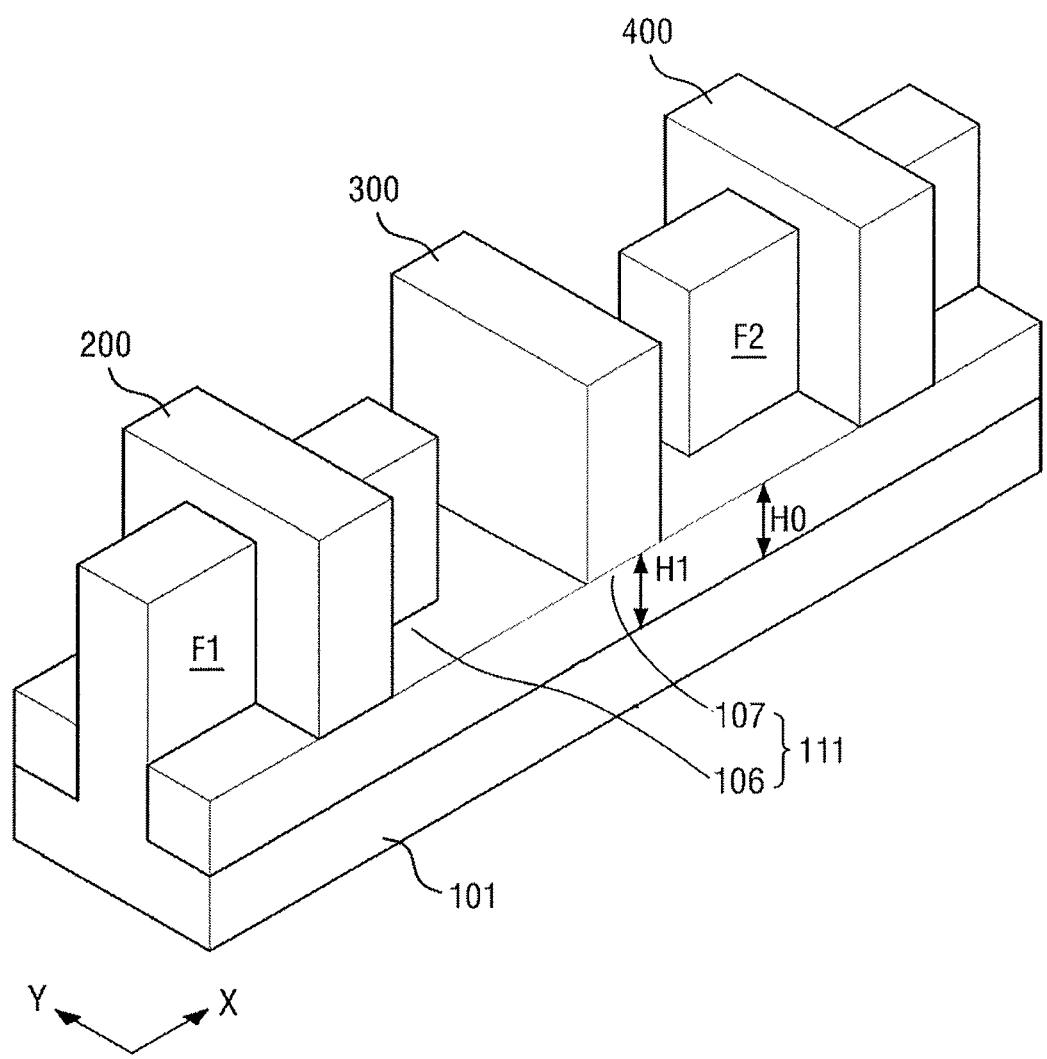
FIG. 2 is a perspective view of the semiconductor device according to an example embodiment.
Figure 3:
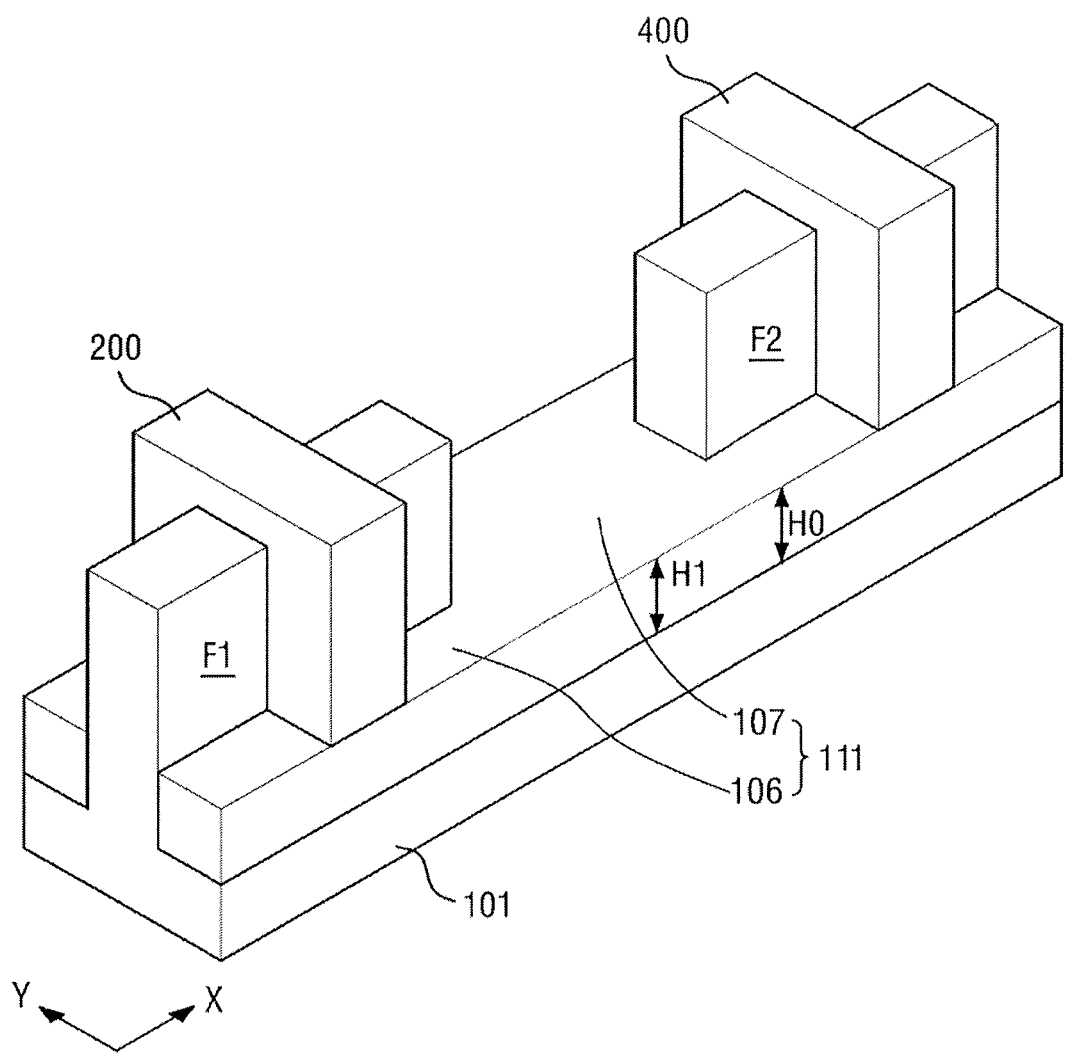
FIG. 3 is a partial perspective view illustrating a first fin portion, a second fin portion, and a field insulating layer of FIG. 2.
Figure 4:
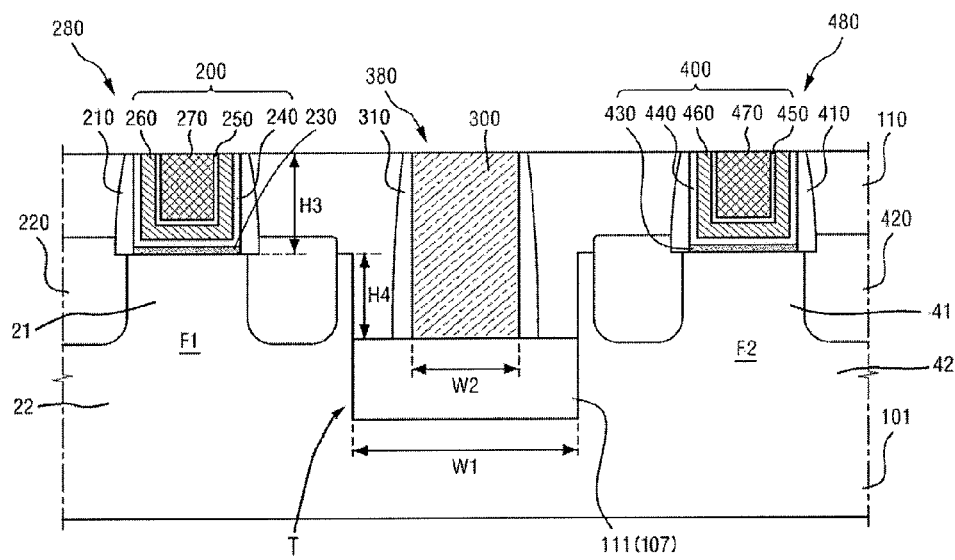
FIG. 4 is a cross-sectional view taken along line A-A of FIG. 1.

FIG. 1 is a layout view of a semiconductor device according to an example embodiment. FIG. 2 is a perspective view of the semiconductor device according to an example embodiment. FIG. 3 is a partial perspective view illustrating a first fin portion, a second fin portion, and a field insulating layer of FIG. 2. FIG. 4 is a cross-sectional view taken along line A-A of FIG. 1.

In an example embodiment, although a fin shape is exemplified in FIG. 1 through FIG. 4, embodiments not limited thereto. Thus, a body having a wire shape instead of a fin shape may be provided. Meanwhile, although the example embodiment illustrates a case in which two fin portions F1 and F2 are disposed on a substrate 101, embodiments are not limited thereto.

Referring to FIG. 1 through FIG. 4, the semiconductor device according to an example embodiment may include a first fin portion F1, a second fin portion F2, a first metal gate 200, a second metal gate 400, and a silicon gate 300.

The substrate 101 may be, for example, bulk silicon or a silicon-on insulator (SOI). Unlike this, the substrate 101 may be a silicon substrate or may contain another material, for example, silicon germanium, indium antimonide, a lead telluride compound, indium arsenide, indium phosphide, gallium arsenide, or gallium antimonide. Alternatively, the substrate 101 may include an epitaxial layer formed on a base substrate.

The first fin portion F1 and the second fin portion F2 may be respectively extended lengthwise in a first direction (X). The first fin portion F1 and the second fin portion F2 may be formed to be parallel to each other in a length direction.

Since the first fin portion F1 and the second fin portion F2 are respectively elongated in the first direction (X), the first fin portion F1 and the second fin portion F2 may include lengths 10a and 20a formed in the first direction (X) and widths 10b and 20b formed in a second direction (Y).

That is, disposing the first fin portion F1 and the second fin portion F2 to be parallel to each other in the length direction means that the width 10b of the first fin portion F1 and the width 20b of the second fin portion F2 are opposite to each other. However, the dispositions of the first fin portion F1 and the second fin portion F2 are not limited thereto and may be variously formed.

Even in a case in which corners of the first fin portion F1 and the second fin portion F2 are roundly formed, it would be obvious that a person having ordinary skill in the art could distinguish the lengths and widths.

The first fin portion F1 and the second fin portion F2 may be formed adjacent to each other. The first fin portion F1 and the second fin portion F2 parallel to each other in the length direction may be separated from each other by a trench T.

The trench T may be formed between the first fin portion F1 and the second fin portion F2. More specifically, the trench T may be formed to contact the width 10b of the first fin portion F1 and the width 20b of the second fin portion F2.

The first fin portion F1 and the second fin portion F2 refer to active patterns used in a multi-gate transistor. That is, in the first fin portion F1 and the second fin portion F2, channels may be connectively formed in three surfaces of the fin portions or a channel may be formed in opposite two surfaces of the fin portions.

The first fin portion F1 and the second fin portion F2 may be portions of the substrate 101 and may include an epitaxial layer grown from the substrate 101.

The first fin portion F1 and the second fin portion F2 may contain, for example, silicon or germanium, an elemental semiconductor material. In addition, the first fin portion F1 and the second fin portion F2 may contain a compound semiconductor, for example, a group IV-IV compound semiconductor or a group III-V compound semiconductor.

In detail, the group IV-IV compound semiconductor of the first fin portion F1 and the second fin portion F2 may be formed of a binary compound or a ternary compound containing at least two or more of carbon (C), silicon (Si), germanium (Ge) and tin (Sn), or a compound containing the said compound doped with a group IV element.

The group III-V compound semiconductor of the first fin portion F1 and the second fin portion F2 may be formed of a binary compound, a ternary compound, or a quaternary compound, formed by combining at least one of aluminum (Al), gallium (Ga) and indium (In) as a group III element with one of phosphorus (P), arsenic (As) and antimony (Sb) as a group V element.

In a semiconductor device according to example embodiments, the first fin portion F1 and the second fin portion F2 are exemplified as fin-shaped silicon patterns containing silicon.

A field insulating layer 111 may be formed on the substrate 101. The field insulating layer 111 may be formed on the circumferences of the first fin portion F1 and the second fin portion F2, so that the first fin portion F1 and the second fin portion F2 may be defined by the field insulating layer 111.

The field insulating layer 111 may include a first region 106 and a second region 107. The first region 106 of the field insulating layer may contact a length 110a of the first fin portion F1 and a length 210a of the second fin portion F2. The first region 106 of the field insulating layer may be elongated and extended in the first direction (X) along the length 110a of the first fin portion F1 and the length 210a of the second fin portion F2.

The second region 107 of the field insulating layer 111 may contact a width 110b of the first fin portion F1 and a width 210b of the second fin portion F2. The second region 107 of the field insulating layer 111 may be formed between the width 110b of the first fin portion F1 and the width 210b of the second fin portion F2.

The second region 107 of the field insulating layer may fill a portion of a trench T formed between the first fin portion F1 and the second fin portion F2.

An upper surface of the field insulating layer 111 may be lower than an upper surface of the first fin portion F1 and an upper surface of the second fin portion F2. More specifically, an upper surface of the first region 106 of the field insulating layer and an upper surface of the second region 107 thereof may be lower than the upper surface of the first fin portion F1 and the upper surface of the second fin portion F2.

In other words, based on a bottom of the trench T, a height H0 of the first region 106 of the field insulating layer 111 and a height H1 of the second region 107 of the field insulating layer 111 may be respectively lower than a height of the first fin portion F1 and a height of the second fin portion F2.

The field insulating layer 111 may cover a portion of the first fin portion F1 and a portion of the second fin portion F2. The first fin portion F1 may include an upper portion 21 and a lower portion 22, and the second fin portion F2 may include an upper portion 41 and a lower portion 42.

The field insulating layer 111 may cover the lower portion 22 of the first fin portion F1 and the lower portion 42 of the second fin portion F2. However, the field insulating layer 111 may not cover the upper portion 21 of the first fin portion F1 and the upper portion 41 of the second fin portion F2. That is, the field insulating layer 111 may not contact the upper portion 21 of the first fin portion F1 and the upper portion 41 of the second fin portion F2.

In other words, the upper portion 21 of the first fin portion F1 and the upper portion 41 of the second fin portion F2 may respectively protrude upwardly from the upper surface of the first region 106 of the field insulating layer 111 and the upper surface of the second region 107 thereof.

In addition, the respective upper surfaces of the first region 106 and the second region 107 of the field insulating layer 111 may be flat surfaces. That is, the upper surface of the field insulating layer 111 may be flat.

The field insulating layer 111 may be, for example, an oxide layer, a nitride layer, an oxynitride layer or a combination layer thereof.

An interlayer insulating layer 110 may be formed on the substrate 101. The interlayer insulating layer 110 may cover the first fin portion F1, the second fin portion F2, and the field insulating layer 111.

The interlayer insulating layer 110 may include a first trench 280, a second trench 480, and a third trench 380. The first trench 280 may extend in the second direction (Y) and intersect the first fin portion F1.

The first trench 280 may expose a part of the first fin portion F. The second trench 480 may extend in the second direction (Y) and intersect the second fin portion F2. The second trench 480 may expose a part of the second fin portion F2.

The third trench 380 may extend in the second direction (Y), between the first trench 280 and the second trench 480. The third trench 380 may be formed across a space between the first fin portion F and the second fin portion F2. The third trench 380 may expose the upper surface of the second region 107 of the field insulating layer 111.

The interlayer insulating layer 110 may contain at least one of a silicon oxide, a silicon nitride, a silicon oxynitride and low-K materials. The low-K materials may include, for example, FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO(Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or combinations thereof, but is not limited thereto.

The first metal gate 200 may extend in the second direction (Y) and may intersect the first fin portion F1. The first metal gate 200 may be formed within the first trench 280.

The first metal gate 200 may be formed on the first fin portion F1 and the field insulating layer 111. The first metal gate 200 may cover the first fin portion F1 protruding upwardly from the upper surface of the field insulating layer 111, the upper portion 21 of the first fin portion F1. The first metal gate 200 may have a first height H3 and an upwardly protruding shape.

The second metal gate 400 may extend in the second direction (Y) and may intersect the second fin portion F2. The second metal gate 400 may be formed within the second trench 480.

The second metal gate 400 may be formed on the second fin portion F2 and the field insulating layer 111. The second metal gate 400 may cover the second fin portion F2 protruding upwardly from the upper surface of the field insulating layer 111, the upper portion 41 of the second fin portion F2. The second metal gate 400 may have a height equal to that of the first metal gate 200 and an upwardly protruding shape, but is not limited thereto. Thus, the heights of the first metal gate 200 and the second metal gate 400 may be different from each other.

The first metal gate 200 may be disposed on a first interface layer 230 and may include a first high-k layer 240, a first work function adjusting layer 260, a first barrier layer 250 and a first metal layer 270. In addition, a spacer 210 may be disposed on sidewalls of the first metal gate 200.

The second metal gate 400 may be disposed on a second interface layer 430 and may include a second high-k layer 440, a second work function adjusting layer 460, a second barrier layer 450 and a second metal layer 470. In addition, a spacer 410 may be disposed on sidewalls of the second metal gate 400.

The first and second interface layers 230 and 430 may include a silicon oxide layer and may prevent interface defects between the upper surfaces of the first and second fin portions F1 and F2 and the first and second high-k layers 240 and 440.

The first and second high-k layers 240 and 440 may be formed of a material having a high dielectric constant, for example, a high-k material. Each of the first and second high-k layers 240 and 440 may contain a high dielectric material having a dielectric constant higher than those of a silicon oxide, a silicon oxynitride, a silicon nitride and a silicon oxide. The high dielectric material may contain, for example, one or more among a hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide or lead zinc niobate, but is not limited thereto.

The respective first and second high-k layers 240 and 440 may be formed on bottom surfaces and sidewalls of the first and second trenches 280 and 480. The respective first and second high-k layers 240 and 440 may be formed along profiles of the first and second fin portions F1 and F2.

The first and second work function adjusting layers 260 and 460 may be p-type work function adjusting layers or n-type work function adjusting layers. Unlike as those illustrated in the example embodiment, the first and second work function adjusting layers 260 and 460 may include a plurality of layers. When the first and second work function adjusting layers 260 and 460 are p-type work function adjusting layers, they may contain TiN or TaN. When the first and second work function adjusting layers 260 and 460 are n-type work function adjusting layers, they may contain at least one of TiAl, TiAlC, TiAlN, TaC, TiC, or HfSi.

The first and second work function adjusting layers 260 and 460 may be formed on the bottom surfaces and the sidewalls of the first and second trenches 280 and 480. The first and second work function adjusting layers 260 and 460 may be formed along the profiles of the first and second fin portions F1 and F2.

The first and second barrier layers 250 and 450 may contain TiN and may prevent materials contained in the first and second metal layers 270 and 470 from being diffused into the first and second trenches 280 and 480.

The first and second barrier layers 250 and 450 may be formed on the bottom surfaces and the sidewalls of the first and second trenches 280 and 480. The first and second barrier layers 250 and 450 may be formed along the profiles of the first and second fin portions F1 and F2.

The first and second metal layers 270 and 470 may contain, for example, Al, W or the like, and may fill remaining portions of the first and second trenches 280 and 480.

The first and second spacers 210 and 410 may be formed on the sidewalls of the first and second metal gates 200 and 400 to extend in an upward direction and may have a height substantially equal to that of the interlayer insulating layer 110. The first and second spacers 210 and 410 may be formed of a silicon nitride or a silicon oxynitride. The example embodiment illustrates a case in which the first and second spacers 210 and 410 are single layers, but is not limited thereto. Thus, each of the first and second spacers 210 and 410 may be formed in multiple layers. In a case in which the first and second spacers 210 and 410 are formed in multiple layers, the multiple layers may be sequentially stacked on the sidewalls of the first and second metal gates 200 and 400.

The first metal gate 200 and the second metal gate 400 may be formed, for example, through a replacement process (or a gate-last process), but is not limited thereto.

The silicon gate 300 may be formed on the second region 107 of the field insulating layer 111. The silicon gate 300 may be extended in the second direction (Y). The silicon gate 300 may be formed within the third trench 380 exposing the upper surface of the second region 107 of the field insulating layer 111.

The silicon gate 300 may go through between the first fin portion F1 and the second fin portion F2. More specifically, the silicon gate 300 may go through between the width 110b of the first fin portion F1 and the width 210b of the second fin portion F2.

Since the silicon gate 300 is formed to go through between the first fin portion F1 and the second fin portion F2, the silicon gate 300 may not contact the first fin portion F1 and the second fin portion F2. That is, the silicon gate 300 may be spaced apart from the first fin portion F1 and the second fin portion F2.

In addition, the second region 107 of the field insulating layer 111 may have a first width W1 and a bottom surface of the silicon gate 300 may have a second width W2. As illustrated in the example embodiment, the first width W1 is greater than the second width W2. Thus, the silicon gate 300 may be formed within the second region 107 of the field insulating layer 111. The bottom surface of the silicon gate 300 may have an area smaller than that of the upper surface of the second region 107 of the field insulating layer 111.

Sidewalls of the third trench 380 on which the silicon gate 300 is formed may be defined by the interlayer insulating layer 110, not by the first fin portion F1 and the second fin portion F2.

That is, as illustrated in the example embodiment, since the second width W2 of the silicon gate 300 is narrower than the width W1 of the second region 107 of the field insulating layer 111, portions of the interlayer insulating layer 110 may be disposed between the silicon gate 300 and the upper portions 21 and 41 of the first and second fin portions F1 and F2.

An upper surface of the silicon gate 300 may be positioned to be coplanar with an upper surface of the first metal gate 200 and an upper surface of the second metal gate 400. The upper surface of the first metal gate 200 and the upper surface of the second metal gate 400 may be positioned to be coplanar with the upper surface of the interlayer insulating layer 110.

A height of the silicon gate 300 may be greater than heights of the upper portions 21 and 41 of the first and second fin portions F1 and F2 that protrude upwardly from the upper surface of the second region 107 of the field insulating layer 111.

That is, referring to FIG. 4 again, when the height of the upper portion 21 of the first fin portion F1 is a second height H4 and the height of the first metal gate 200 is the first height H3, the height of the silicon gate 300 may be identical to the sum of the second height H4 and the first height H3, but is not limited thereto.

The bottom surface of the silicon gate 300 may be lower than the upper surface of the first fin portion F1 and the upper surface of the second fin portion F2. In other words, the bottom surface of the silicon gate 300 may be closer to the bottom of the trench T as compared to the upper surface of the first fin portion F1 and the upper surface of the second fin portion F2.

In the semiconductor device according to an example embodiment, the silicon gate 300 may directly contact the second region 107 of the field insulating layer 111. The bottom surface of the silicon gate 300 may be in contact with the upper surface of the second region 107 of the field insulating layer 111. Accordingly, the height H3+H4 of the silicon gate 300 may be substantially equal to the height of the interlayer insulating layer 110 covering the second region 107 of the field insulating layer 111.

The silicon gate 300 may contain silicon materials, for example, polysilicon, but is not limited thereto.

In addition, a third spacer 310 may be disposed on the sidewalls of the silicon gate 300. The third spacer 310 may be formed of a material the same as those of the first and second spacers 210 and 410.

The third spacer 310 may not be formed on the bottom surface of the third trench 380. That is, the third spacer 310 may not be formed between the bottom surface of the silicon gate 300 and the upper surface of the second region 107 of the field insulating layer 111.

The third spacer 310 may not contact the first fin portion F1 and the second fin portion F2. The interlayer insulating layer 110 may be interposed between the third spacer 310 and the width 110b of the first fin portion F1 and between the third spacer 310 and the width 210b of the second fin portion F2.

That is, the third spacer 310 may be interposed between the silicon gate 300 and the interlayer insulating layer 110.

The third spacer 310 may come into contact with the upper surface of the second region 107 of the field insulating layer 111. The height H3+H4 of the third spacer 310 may be substantially equal to a thickness of the interlayer insulating layer 110 covering the second region 107 of the field insulating layer 111. The third spacer 310 may contain a material having an etching selection ratio different from that of the silicon gate 300

The first spacer 210, the second spacer 410, and the third spacer 310 may respectively contain at least one among, for example, a silicon nitride (SiN), a silicon oxynitride (SiON), a silicon oxide ($SiO_2$), a silicon oxycarbide nitride (SiOCN), and combinations thereof.

A first source/drain 220 may be formed on both sides of the first metal gate 200. The first source/drain 220 may be formed between the first metal gate 200 and the silicon gate 300. The first source/drain 220 may be formed by doping impurities into the upper portion 21 of the first fin portion F1, but is not limited thereto.

A second source/drain 420 may be formed on both sides of the second metal gate 400. The second source/drain 420 may be formed between the second metal gate 400 and the silicon gate 300. The second source/drain 420 may be formed by doping impurities into the upper portion 41 of the second fin portion F2, but is not limited thereto.

The example embodiment illustrates a case in which the first source/drain 220 and the second source/drain 420 are disposed within the first fin portion F1 and the second fin portion F2, respectively, and upper surfaces of the first source/drain 220 and the second source/drain 420 are exposed, but is not limited thereto. Thus, the first source/drain 220 and the second source/drain 420 may also be exposed to side surfaces of the first and second fin portions F1 and F2.

In addition, the example embodiment illustrates a case in which the opposite widths 10b and 20b of the first and second fin portions F1 and F2 have vertical sidewall shapes, but is not limited thereto. Thus, the widths 10b and 20b of the first and second fin portions F1 and F2 may be inclined.

Figure 5:
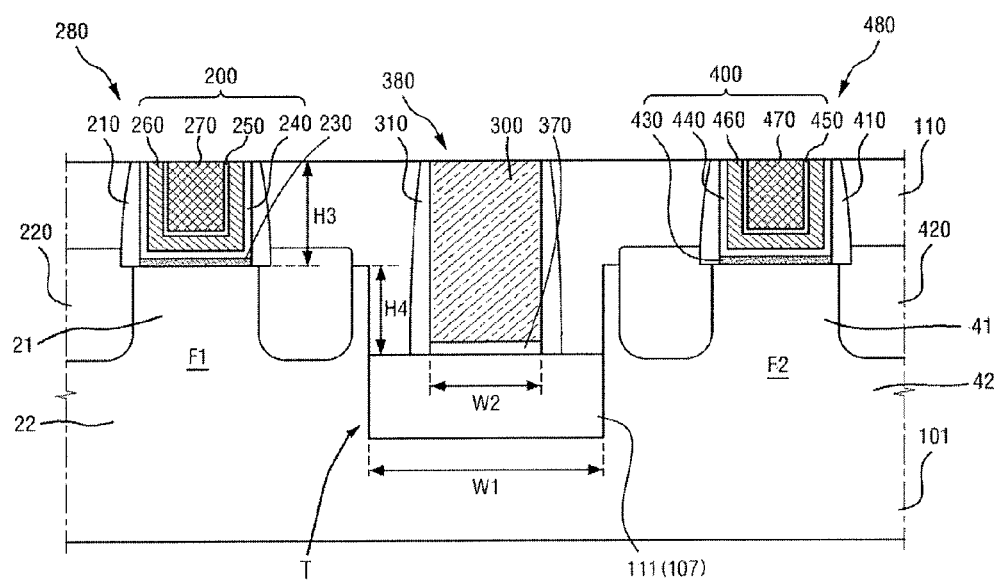
FIG. 5 is a cross-sectional view of a semiconductor device according to another example embodiment.

FIG. 5 is a cross-sectional view of a semiconductor device according to another example embodiment.

The semiconductor device according to another example embodiment is substantially equal to the semiconductor device according to an example embodiment as described above, except that it includes an insulating film 370 between the silicon gate 300 and the second region 107 of the field insulating layer 111. Thus, a repeated description will be omitted.

Referring to FIG. 5, the semiconductor device according to another example embodiment may further include the insulating film 370.

The insulating film 370 may be formed on the bottom surface of the third trench 380. However, the insulating film 370 may not be formed on the sidewalls of the third trench 380. That is, the insulating film 370 may not be formed between the sidewall of the third trench 380 and the third spacer 310.

The insulating film 370 may contact the silicon gate 300.

The insulating film 370 may be formed between the silicon gate 300 and the second region 107 of the field insulating layer 111, but the bottom surface of the silicon gate 300 may still be lower than the upper surface of the first fin portion F1 and the upper surface of the second fin portion F2.

The insulating film 370 may contain, for example, a silicon oxide, but is not limited thereto.

With reference to FIG. 6 through FIG. 14, a method of manufacturing a semiconductor device according to an example embodiment will be described. FIG. 6 through FIG. 14 are cross-sectional views illustrating a method of manufacturing a semiconductor device according to an example embodiment.

Figure 6:
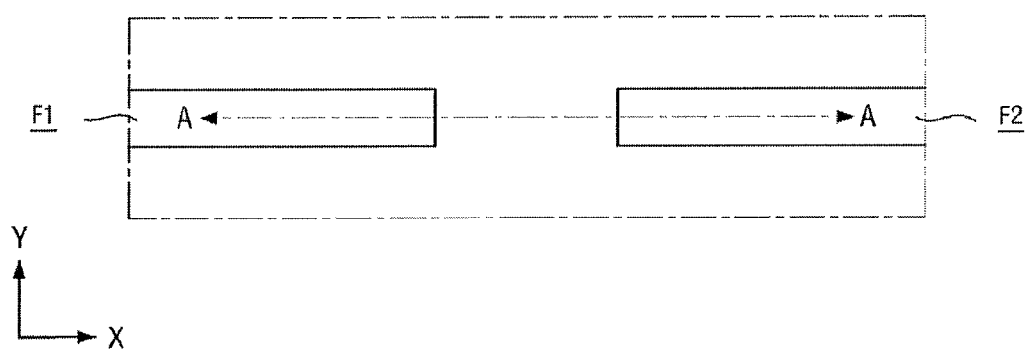
FIG. 6 through FIG. 14 are cross-sectional views illustrating a method of manufacturing a semiconductor device according to an example embodiment.

Referring to FIG. 6, the first fin portion F1 and the second fin portion F2 may be formed to extend lengthwise in the first direction (X).

The first fin portion F1 and the second fin portion F2 may be elongated and arranged in the first direction (X).

The subsequent description will be made based on the cross-sectional view taken along line A-A of FIG. 6.

Figure 7:
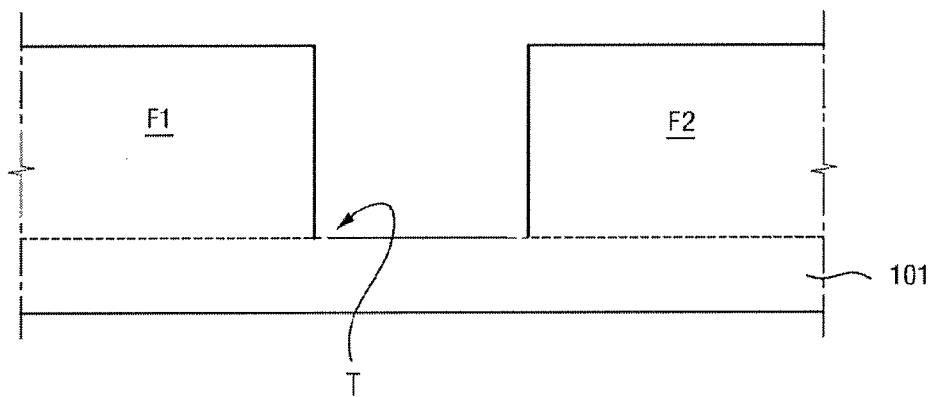

Then, referring to FIG. 7, the trench T may be formed between the first fin portion F1 and the second fin portion F2 to separate the first fin portion F1 and the second fin portion F2 from each other.

The upper surface of the first fin portion F1 and the upper surface of the second fin portion F2 are illustrated as being exposed outwardly, but embodiments are not limited thereto. Mask patterns used in a process of forming the first fin portion F1 and the second fin portion F2 may remain on the upper surface of the first fin portion F1 and the upper surface of the second fin portion F2.

Figure 8:
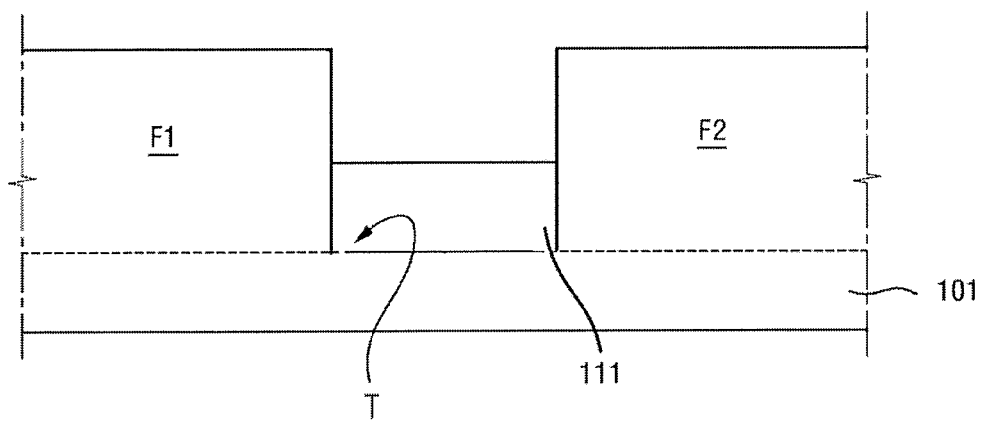

Referring to FIG. 8, the field insulating layer 111 may be formed to cover a portion of the first fin portion F1 and a portion of the second fin portion F2.

The field insulating layer 111 may partially fill the trench T formed between the first fin portion F1 and the second fin portion F2.

During the process of forming the field insulating layer 111 covering a portion of the first fin portion F1 and a portion of the second fin portion F2, doping for controlling a threshold voltage may be performed on the first fin portion F1 and the second fin portion F2, but embodiments are not limited thereto.

Figure 9:
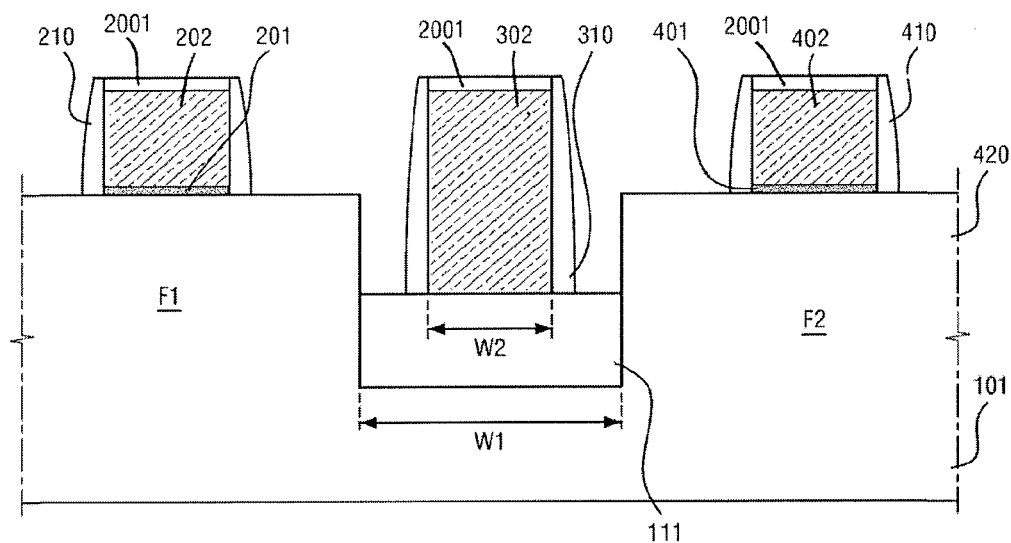

Referring to FIG. 9, an etching process may be conducted using a first mask pattern 2001 to form a first dummy gate electrode 202, a second dummy gate electrode 402, and a third dummy gate electrode 302.

The first dummy gate electrode 202 may extend in the second direction Y and may be formed on the first fin portion F1. A first dummy gate insulating layer 201 may be formed between the first dummy gate electrode 202 and the first fin portion F1.

The second dummy gate electrode 402 may extend in the second direction Y and may be formed on the second fin portion F2. A second dummy gate insulating layer 401 may be formed between the second dummy gate electrode 402 and the second fin portion F2.

The third dummy gate electrode 302 may extend in the second direction Y and may be formed between the first fin portion F1 and the second fin portion F2. The third dummy gate electrode 302 may be formed on the field insulating layer 111 formed between the width of the first fin portion F1 and the width of the second fin portion F2.

Although a case in which a third dummy gate insulating layer is not formed between the third dummy gate electrode 302 and the field insulating layer 111, it is merely provided for convenience of explanation and the embodiments are not limited thereto.

It goes without saying that the third dummy gate insulating layer may be formed between the third dummy gate electrode 302 and the field insulating layer 111 according to methods of forming the first dummy gate insulating layer 201 and the second dummy gate insulating layer 401.

The first to third dummy gate electrodes 202, 402 and 302 may respectively contain, for example, polysilicon or amorphous silicon, but are not limited thereto.

Then, the first spacer 210 may be formed on the sidewalls of the first dummy gate electrode 202, the second spacer 410 may be formed on the sidewalls of the second dummy gate electrode 402, and the third spacer 310 may be formed on the sidewalls of the third dummy gate electrode 302.

Figure 10:
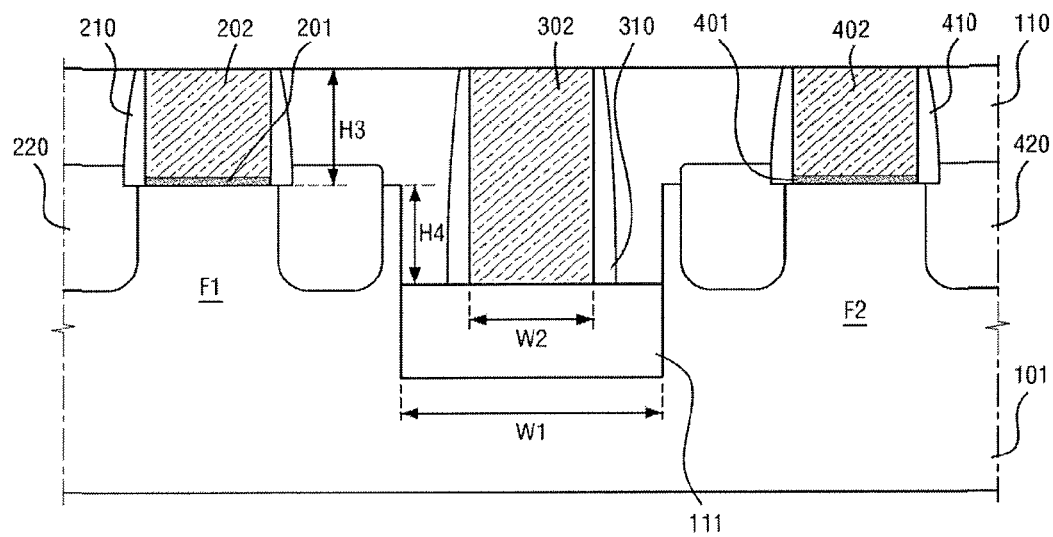

Referring to FIG. 10, the first source/drain 220 may be formed within the first fin portion F1, in the both sides of the first dummy gate electrode 202. The second source/drain 420 may be formed within the second fin portion F2, in the both sides of the second dummy gate electrode 402. Each of the first source/drain 220 and the second source/drain 420 may include an epitaxial layer.

Next, the interlayer insulating layer 110 covering the first fin portion F1 and the second fin portion F2 as well as the first to third dummy gate electrodes 202, 402 and 302 may be formed on the field insulating layer 111.

Until upper surfaces of the first to third dummy gate electrodes 202, 402 and 302 are exposed, the interlayer insulating layer 110 may be planarized. Accordingly, the first mask pattern 2001 may be removed.

Figure 11:
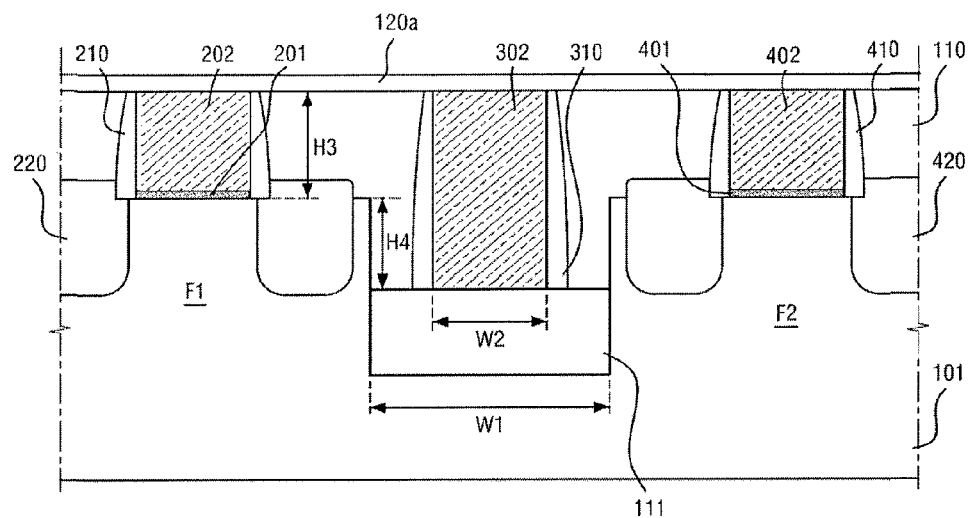

Referring to FIG. 11, a second mask 120a covering upper surfaces of the interlayer insulating layer 110 and the first to third dummy gate electrodes 202, 402 and 302 may be formed.

The second mask 120a may contain at least one among, for example, a silicon nitride (SiN), a silicon oxynitride (SiON), a silicon oxide ($SiO_2$), a silicon oxycarbide nitride (SiOCN), and combinations thereof.

Figure 12:
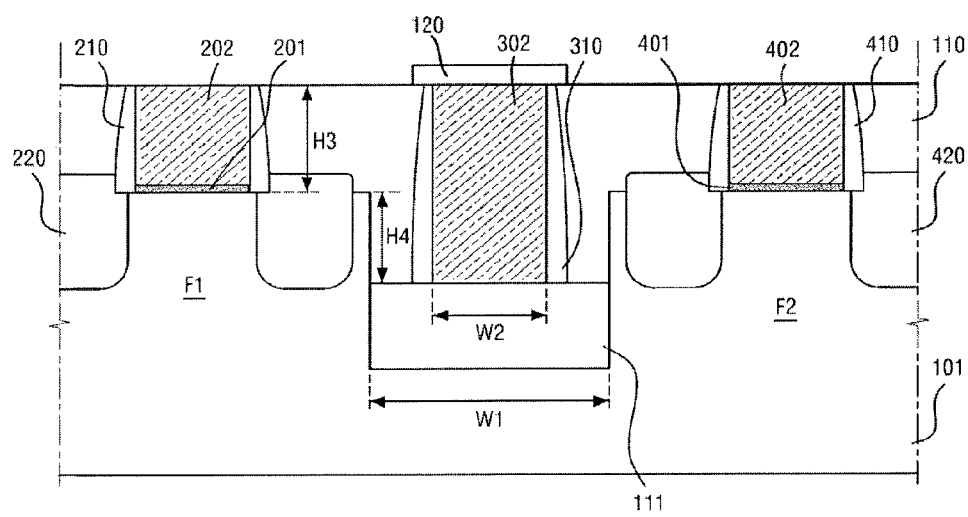

Referring to FIG. 12, the second mask 120a covering the upper surfaces of the first and second dummy gate electrodes 202 and 402 may be removed to form a second mask pattern 120 exposing the upper surfaces of the first and second dummy gate electrodes 202 and 402.

However, the upper surface of the third dummy gate electrode may still be covered with the second mask pattern 120. Although the example embodiment illustrates a case in which the second mask pattern 120 has a length shorter than the first width W1 but slightly greater than the second width W2, but embodiments are not limited thereto. Thus, the second mask pattern 120 may be disposed to have a length or a width covering the upper surface of the third dummy gate electrode 302 while exposing the upper surfaces of the first and second dummy gate electrodes 202 and 402.

Figure 13:
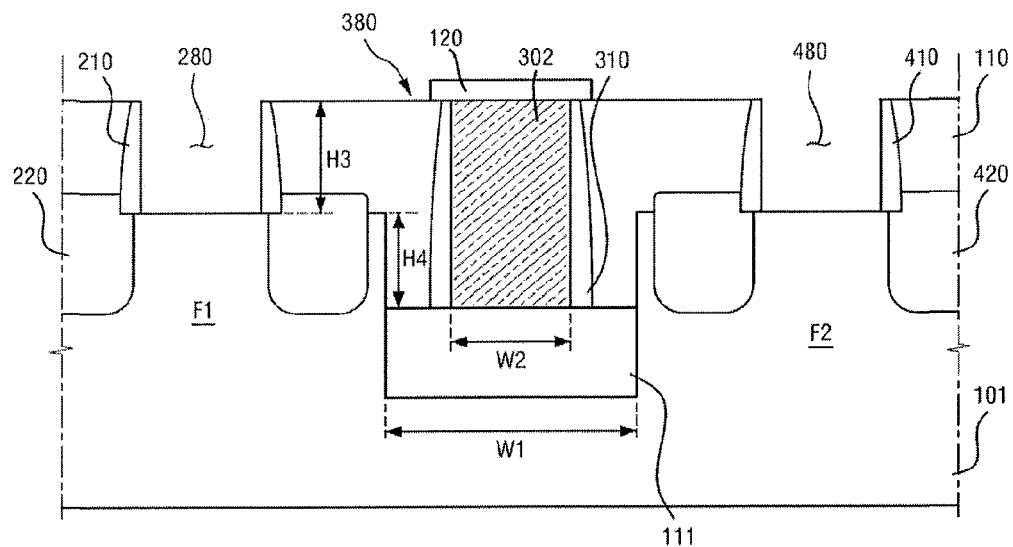
Figure 14:
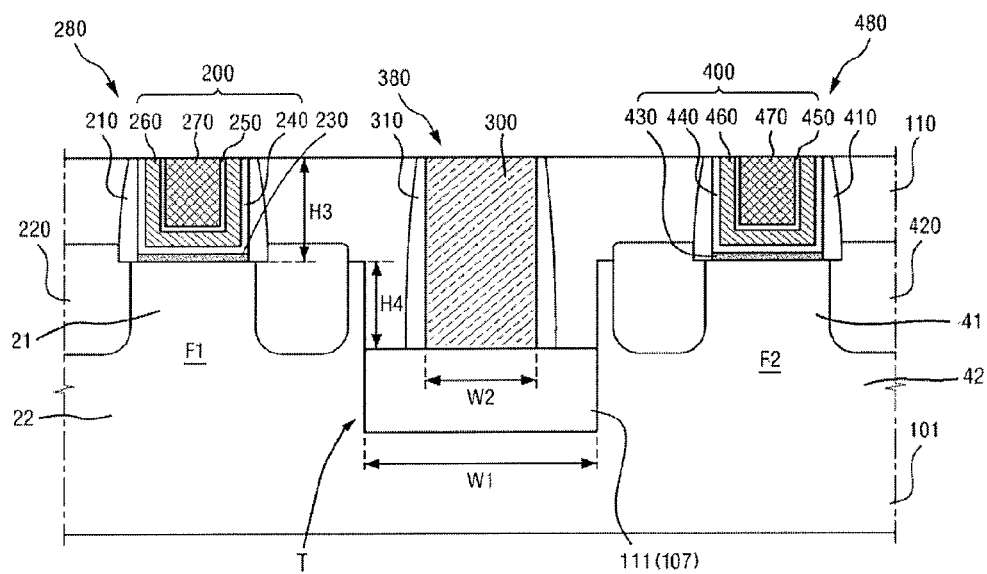

Referring to FIG. 13, the first and second dummy gate electrodes 202 and 402 and the first and second dummy gate insulating layers 201 and 401 may be removed using the second mask pattern 120.

The first dummy gate electrode 202 and the first dummy gate insulating layer 201 may be removed to thereby form the first trench 280 within the interlayer insulating layer 110.

The second dummy gate electrode 402 and the second dummy gate insulating layer 401 may be removed to thereby form the second trench 480 within the interlayer insulating layer 110.

Referring to FIG. 13, the second mask pattern 120 covering the third dummy gate electrode 302 may be removed, and the filling of the first trench 280 and the second trench 480 may be performed. By doing so, the semiconductor device according to an example embodiment is completed.

That is, the silicon gate 300 included in the semiconductor device according to an example embodiment is substantially equal to the third dummy gate electrode 302 in an intermediate-term process. Thus, in an example embodiment, by removing the third dummy gate electrode 302, the silicon gate 300 may be substantially completed in the process of treating the third dummy gate electrode 302 without the inclusion of a process of forming the third trench. Therefore, the silicon gate 300 may be formed on the field insulating layer 111 through a more simple and easy process.

Figure 15:
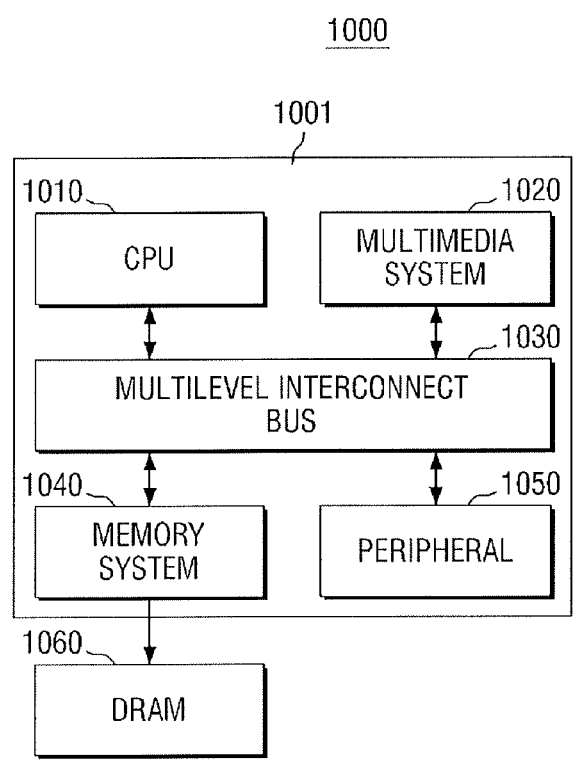
FIG. 15 is a block diagram of a system-on-chip (SoC) including the semiconductor devices according to example embodiments.

FIG. 15 is a block diagram of a system-on-chip (SoC) including the semiconductor devices according to example embodiments.

Referring to FIG. 15, a system-on-chip (SoC) 1000 may include an application processor 1001 and a DRAM 1060.

The application processor 1001 may include a central processing unit (CPU) 1010, a multimedia system 1020, a multilevel interconnect bus 1030, a memory system 1040, and a peripheral circuit 1050.

The CPU 1010 may execute an operation required for driving the SoC 1000. In some exemplary embodiments, the CPU 1010 may be configured in multi-core environments including a plurality of cores.

The multimedia system 1020 may be used to perform various multimedia functions in the SoC 1000. The multimedia system 1020 may include a three-dimensional (3D) engine, a video codec, a display system, a camera system, a post-processor and the like.

The bus 1030 may be used to communicate data among the CPU 1010, the multimedia system 1020, the memory system 1040, and the peripheral circuit 105. In some exemplary embodiments, the bus 1030 may have a multilayer structure. In detail, the bus 1030 may be, for example, a multilayer advanced high-performance bus (AHB) or a multilayer advanced extensible interface (AXI), but embodiments are not limited thereto.

The memory system 1040 may provide environments required for the application processor 1001 to be connected to an external memory (for example, the DRAM 1060) and to perform a high speed operation. In some exemplary embodiments, the memory system 1040 may include a separate controller (for example, a DRAM controller) for controlling an external memory (for example, the DRAM 1060).

The peripheral circuit 1050 may provide environments required for the SoC 1000 to be smoothly connected to an external device (for example, a main board). Accordingly, the peripheral circuit 1050 may include various interfaces allowing an external device connected to the SoC 1000 to be compatible.

The DRAM 1060 may function as an operating memory required for operating the application processor 1001. In some exemplary embodiments, as illustrated in the exemplary embodiment, the DRAM 1060 may be disposed outside the application processor 1001. In detail, the DRAM 1060, together with the application processor 1001, may be packaged in the form of PoP (Package on Package).

At least one among the components of the SoC 1000 may include at least one of the semiconductor devices according to the foregoing exemplary embodiments.

Figure 16:
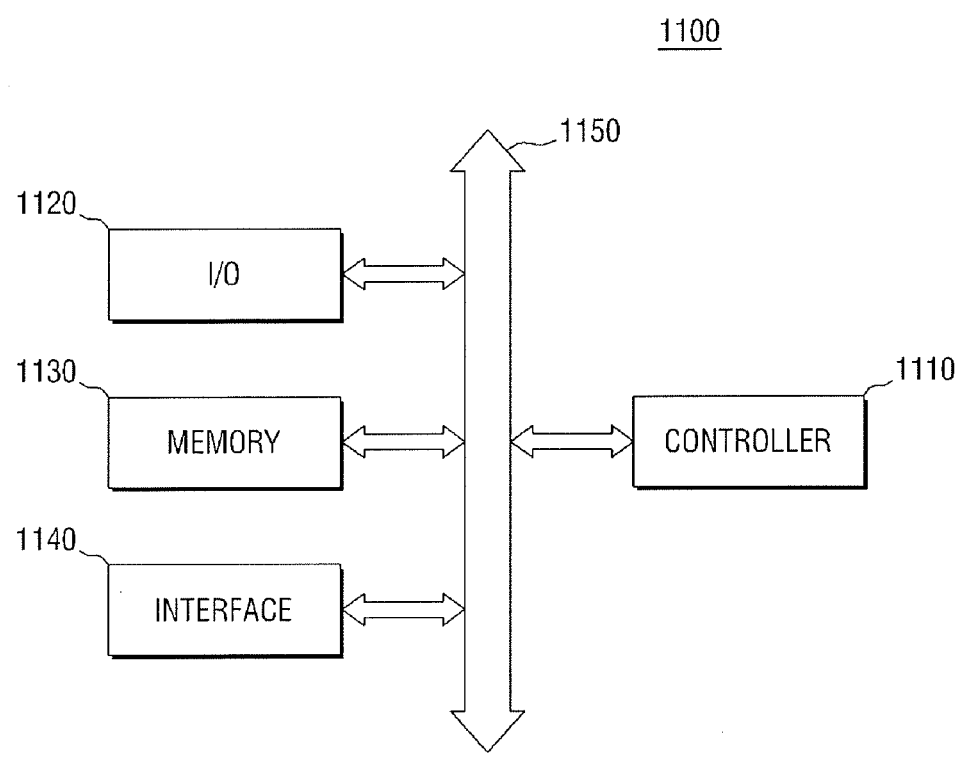
FIG. 16 is a block diagram of an electronic system including the semiconductor devices according to example embodiments.

FIG. 16 is a block diagram of an electronic system including the semiconductor devices according to example embodiments.

Referring to FIG. 16, an electronic system 1100 according to an example embodiment may include a controller 1110, an input/output device (I/O) 1120, a memory device 1130, an interface 1140 and a bus 1150. The controller 1110, the input/output device (I/O) 1120, the memory device 1130, and/or the interface 1140 may be coupled to each other through the bus 1150. The bust 1150 may correspond to a path through which data is transferred.

The controller 1110 may include at least one of a microprocessor, a digital signal processor, a microcontroller and logic devices capable of performing similar functions thereto. The input/output device (I/O) 1120 may include a keypad, keyboard, a display and the like. The memory device 1130 may store data and/or a command or the like therein. The interface 1140 may transmit data to communication networks and receive data from the communication networks. The interface 1140 may have a wired or wireless form. For example, the interface 1140 may include an antenna, a wired/wireless transceiver and the like. Although not illustrated, the electronic system 1100 may be an operating memory for improving operations of the controller 1110 and may further include a high speed dynamic random access memory and/or static random access memory or the like.

The semiconductor devices according to the foregoing exemplary embodiments may be provided within the memory device 1130 or may be provided as parts of the controller 1110, the input/output device (I/O) 1120 and the like.

The electronic system 1100 may be applied to personal digital assistants (PDA), portable computers, web tablets, wireless phones, mobile phones, digital music players, memory cards, or all electrical products capable of transmitting and receiving information in wireless environments.

Figure 17:
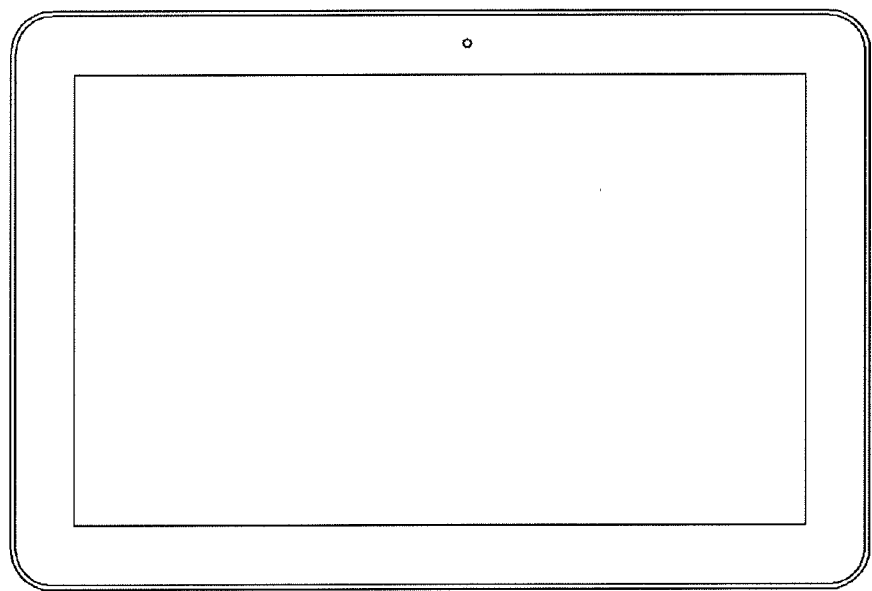
FIG. 17 through FIG. 19 are example semiconductor systems to which the semiconductor devices according to the example embodiments.
Figure 18:
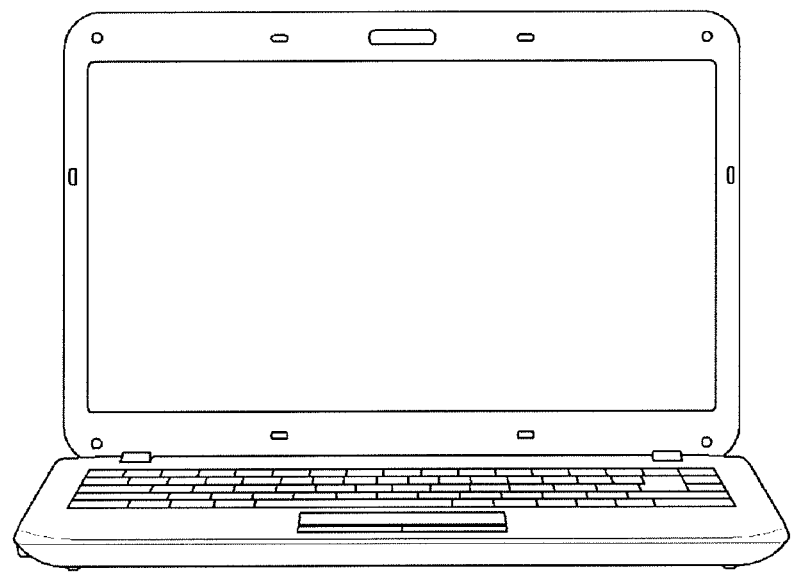
Figure 19:
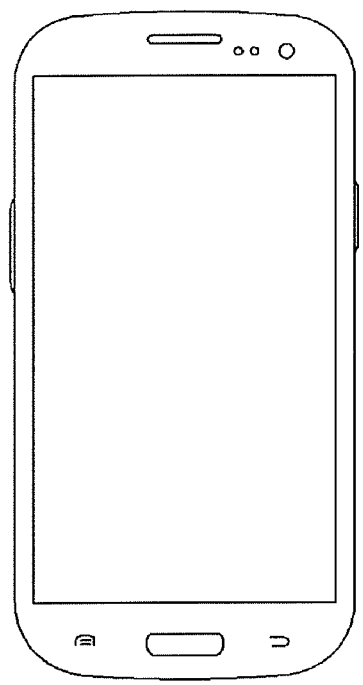

FIG. 17 through FIG. 19 are exemplary semiconductor systems to which the semiconductor devices according to the example embodiments are applicable.

FIG. 17 is a view illustrating a tablet PC 1200, FIG. 18 is a view illustrating a laptop computer 1300, and FIG. 19 is a view illustrating a smartphone 1400. The semiconductor devices according to the exemplary embodiments may be used in the tablet PC 1200, the laptop computer 1300, the smartphone 1400 and the like.

In addition, it may be apparent to a person having ordinary skill in the art that the semiconductor devices according to some exemplary embodiments may be applied to other integrated circuit devices (not shown).

That is, in the above description, only the tablet PC 1200, the laptop computer 1300, and the smartphone 1400 are exemplified as semiconductor systems according to the embodiments. However, examples of the semiconductor systems are not limited thereto.

In some embodiments, the semiconductor systems may be implemented as computers, UMPC (Ultra Mobile PC), workstations, net-book computers, personal digital assistants (PDA), portable computers, wireless phones, mobile phones, e-books, portable multimedia player (PMP), portable game consoles, navigation devices, black boxes, digital cameras, 3-dimensional televisions, digital audio recorders, digital audio players, digital picture recorders, digital picture players, digital video recorders, digital video players and the like.

While exemplary embodiments have been shown and described above, it will be apparent to those skilled in the art that modifications and variations could be made without departing from the spirit and scope of the present inventive concept as defined by the appended claims.

What is claimed is:

1. A semiconductor device, comprising:
a first fin portion and a second fin portion arranged on a substrate and extending in a first direction, the first fin portion and the second fin portion being spaced apart from each other in the first direction;
a field insulating layer between the first fin portion and the second fin portion and having an upper surface thereof lower than an upper surface of the first fin portion;
a first metal gate extending in a second direction on the first fin portion; and
a silicon gate extending in the second direction on the field insulating layer and contacting the field insulating layer.

2. The semiconductor device of claim 1, wherein a bottom surface of the silicon gate is lower than the upper surface of the first fin portion and the upper surface of the second fin portion.

3. The semiconductor device of claim 1, wherein a bottom surface of the silicon gate has a width narrower than that of the upper surface of the field insulating layer.

4. The semiconductor device of claim 1, further comprising a spacer on at least one side of the silicon gate, the spacer being in non-contact with the first fin portion and the second fin portion.

5. The semiconductor device of claim 1, wherein a distance from the upper surface of the first fin portion to an upper surface of the first metal gate is smaller than a distance from the upper surface of the field insulating layer to an upper surface of the silicon gate.

6. The semiconductor device of claim 5, wherein the upper surface of the first metal gate and the upper surface of the silicon gate are coplanar positioned.

7. The semiconductor device of claim 1, wherein the field insulating layer extends to lower portions of the first and second fin portions to cover at least portions of the respective first and second fin portions, while not contacting upper portions of the first and second fin portions.

8. The semiconductor device of claim 7, wherein the upper surface of the field insulating layer is flat.

9. The semiconductor device of claim 1, further comprising a source/drain between the first metal gate and the silicon gate, the source/drain being within an upper portion of the first fin portion.

10. The semiconductor device of claim 1, further comprising an interlayer insulating layer on the first fin portion, the second fin portion, and the field insulating layer and including a first trench partially exposing the first fin portion and a second trench partially exposing the field insulating layer,
wherein the first metal gate is within the first trench and the silicon gate is within the second trench.

11. The semiconductor device of claim 10, wherein the interlayer insulating layer extends from the upper surface of the field insulating layer, and the upper surface of the interlayer insulating layer and the upper surface of the silicon gate are coplanar.

12. A semiconductor device, comprising:
a first fin portion and a second fin portion arranged parallel to each other in the longitudinal direction on the substrate, and including a long side and a short side respectively;
a trench between the short side of the first fin portion and the short side of the second fin portion, the short side of the first fin portion and the short side of the second fin portion facing each other;
a field insulating layer filling a portion of the trench;
a silicon gate arranged on the field insulating layer and traversed between the first fin portion and the second fin portion; and
a metal gate intersecting the first fin portion,
wherein a bottom surface of the silicon gate is lower than the upper surface of the first fin portion and the upper surface of the second fin portion.

13. The semiconductor device of claim 12, wherein the silicon gate is spaced from the first fin portion and the second fin portion.

14. The semiconductor device of claim 12, wherein a bottom surface of the silicon gate has a width narrower than that of the upper surface of the field insulating layer.

15. The semiconductor device of claim 12, wherein the upper surface of the first metal gate and the upper surface of the silicon gate are coplanar.

16. A semiconductor device, comprising:
a first fin portion and a second fin portion arranged on a substrate and extending in a first direction, the first fin portion and the second fin portion being spaced apart from each other in the first direction;
a field insulating layer between a lower portion of the first fin portion and a lower portion of the second fin portion and exposing a upper portion of the first fin portion and a upper portion of the second fin portion;
a first metal gate extending in a second direction on the first fin portion; and
a silicon gate extending in the second direction on the field insulating layer and contacting the field insulating layer, a height of the silicon gate being higher than a height of the upper portion of the first fin portion and a height of the upper portion of the second fin portion.

17. The semiconductor device of claim 16, wherein a bottom surface of the silicon gate is lower than the upper surface of the first fin portion and the upper surface of the second fin portion.

18. The semiconductor device of claim 16, wherein the upper surface of the first metal gate and the upper surface of the silicon gate are coplanar.

19. The semiconductor device of claim 16, further comprising an interlayer insulating layer on the first fin portion, the second fin portion, and the field insulating layer and including a first trench exposing the upper portion of the first fin portion and a second trench partially exposing the field insulating layer, wherein the first metal gate is within the first trench and the silicon gate is within the second trench.

20. The semiconductor device of claim 16, further comprising a spacer on at least one side of the silicon gate, the spacer being in non-contact with the first fin portion and the second fin portion.

* * * * *